United States Patent [19]

Pearce

[11] Patent Number: 5,684,305
[45] Date of Patent: Nov. 4, 1997

[54] PILOT TRANSISTOR FOR QUASI-VERTICAL DMOS DEVICE

[75] Inventor: Lawrence George Pearce, Palm Bay, Fla.

[73] Assignee: Harris Corporation, Palm Bay, Fla.

[21] Appl. No.: 483,692

[22] Filed: Jun. 7, 1995

[51] Int. Cl.[6] ................. H01L 29/78; H01L 27/02
[52] U.S. Cl. ................. 257/48; 257/329; 257/335; 257/337; 257/341; 257/343
[58] Field of Search ................. 257/329, 335, 257/337, 341, 343, 401, 48

[56] References Cited

U.S. PATENT DOCUMENTS

| | | | |
|---|---|---|---|
| 4,313,126 | 1/1982 | Krumm et al. | 357/22 |
| 4,554,512 | 11/1985 | Aiello | 330/10 |
| 5,256,893 | 10/1993 | Yasuoka | 257/341 |
| 5,387,875 | 2/1995 | Tateno | 330/10 |
| 5,442,216 | 8/1995 | Gough | 257/341 |

FOREIGN PATENT DOCUMENTS

| | | |
|---|---|---|
| 0 525 777 | 2/1993 | European Pat. Off. . |
| 0557 253 | 8/1993 | European Pat. Off. . |
| 0 655 830 | 5/1995 | European Pat. Off. . |
| 42 90 148 | 10/1992 | Germany . |
| 0267675 | 10/1993 | Japan . |

OTHER PUBLICATIONS

Weyers et al., A 50 V Smart Power Process with Dielectric Isolation by 51 MOX, IEDM 92-225-228, IEEE.
European Search Report mailed Sep. 12, 1996.for EP 96 40 0695.
PCT Communication mailed Oct. 15, 1996 for PCT/US96/08826.
A. Watson Swager, "Power ICs Weighing The Benefits Of Integration", EDN–Electrical Design News, vol. 39, No. 14, Newton, MA, Jul. 1994, pp. 68–72, 74, 76, 78, 80, 82.

*Primary Examiner*—Peter Toby Brown
*Attorney, Agent, or Firm*—Jaeckle Fleischmann Mugel, LLP

[57] ABSTRACT

An isolated pilot transistor 100 for a QVDMOS device 10 has a gate and drain region in symmetry with the sources 20 of device 10 and an additional resistance 116 in the drain 118 to compensate for current spreading between the source 120 and the buried layer resistor 132.

5 Claims, 2 Drawing Sheets

PILOT TRANSISTOR FOR QUASI-VERTICAL DMOS DEVICE

This invention relates in general to power devices, and in particular, to a pilot transistor for measuring power in a power device.

Integrated power devices have fully isolated power DMOS device, typically in the form of an array. One particular type of fully isolated power DMOS device is a quasi-vertical DMOS (QVDMOS) device such as shown and described in co-pending applications serial no. 08/474,559, filed Jun. 7, 1995. Therein is described a power device with QVDMOS array. Such an array comprises a number of source cells each with a common gate disposed between a pair of lateral drain diffusions. Underlying the source cells is a buried layer that contacts the drain diffusions. Accordingly, current flows from the source cells into the buried layer and laterally toward the spaced-apart drain regions and then vertically up to the surface of the drain regions.

With power devices it is often desired to provide a pilot transistor that demonstrates substantially identical operating characteristics, albeit on a smaller scale, to the large power device array. So, if the array comprises 100 sources, then it is common to use a single transistor identical to the transistors in the array. The single transistor will be 1/100th the size of the array and will have operating characteristics including power characteristics proportional to the array.

One solution to the problem has been to use a source pilot that uses one of the embedded source cells. Such a solution is rather simple and depends upon selecting the optimum source cell among the array of sources in the DMOS device. However, it is often desirable to have pilot cell isolated from the source array so that the power in the source array can be effectively monitored by other low power devices such as CMOS control logic. In this way, a relatively low voltage and low power CMOS circuit can use a pilot transistor to monitor the high power of the QVDMOS device. So, the control logic and the pilot transistor can be fabricated on the same circuit yet remain separate. With such an arrangement, the control logic can monitor the power in the QVDMOS power device so that the device can be prevented from unsafe operation.

However, the traditional scaling approach for forming isolated pilot transistors is unsuccessful with power devices having a distributed nature such as an array of QVDMOS sources. By virtue of the distributed nature of the array, merely scaling a single pilot will not mimic the behavior of a large power device.

As such, there is a need for a pilot transistor that accurately matches the performance characteristics of the QVDMOS power device.

SUMMARY

The invention provides a pilot transistor for a QVDMOS power device. The QVDMOS power device has an array of source cells disposed between opposing drain termination regions at opposing drains. The pilot transistor comprises a source region having a source substantially identical to the sources in the source array of the QVDMOS device. The source array is surrounded by a gate termination region having features similar to the portion of the gate surrounding the source cell in the power DMOS device. The source has a body or P-well region substantially identical to the P-well region of the QVDMOS device. Beneath the P-well region is a buried layer that is substantially identical in sheet resistance to the buried layer of the QVDMOS device. It has been found necessary to add an additional resistance in series with the drain region in order to compensate for current spread. Current spread occurs in the pilot transistor because the single source cell does not have adjacent sources to confine the current from the source in its transit to the buried layer. As such, the pilot cell has effectively a lower resistance between the source and the buried layer than did the source cells of the power DMOS device. Such a reduction in resistance is compensated by adding an additional resistance in series with the pilot drain region or by modifying the resistance of the pilot drain region to account for both the resistance of the drain and the added compensating resistance. It is also compensated by using the symmetry of the source array to terminate the pilot gate and shape the pilot drain region.

DETAILED DESCRIPTION

Figure 1:
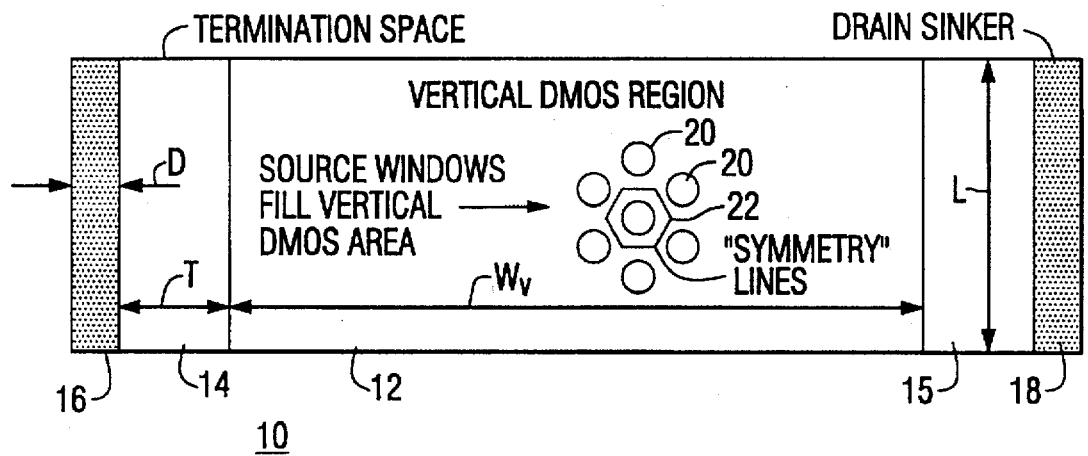
FIG. 1 is a partial planar view of a power DMOS device having an array of source windows.

With reference to FIG. 1, there is generally shown a QVDMOS power device 10. A source region 12 is bordered on either side by identical drain termination regions 14, 15. Adjacent to drain termination regions 14, 15 are drain sinker regions, respectively, 16, 18. The sources are typically circular diffusions 20 that are bounded by a gate 22 with an hexagonal symmetry profile. In other words, the locus of points in a path around a source that is equidistant from the source and its neighbors defines a hexagonal path.

Figure 2:
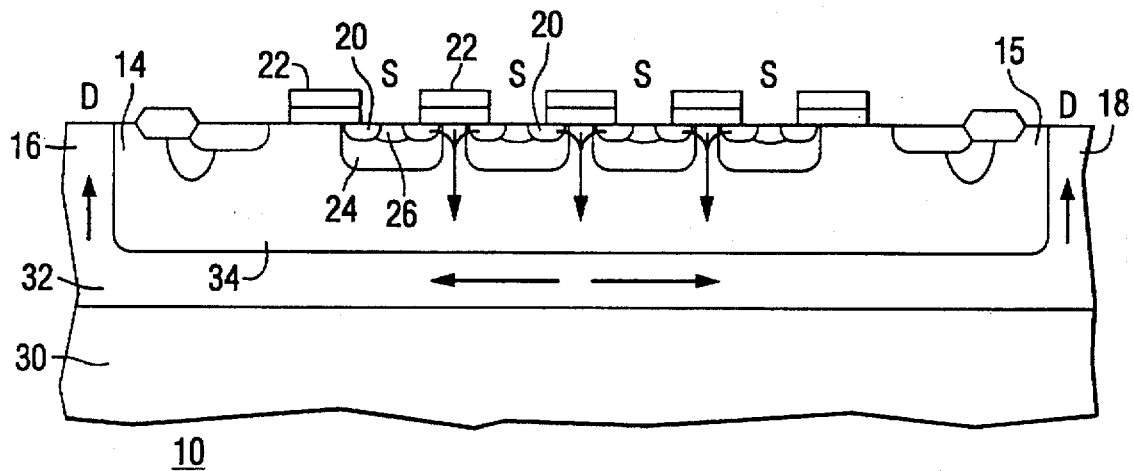
FIG. 2 is a partial cross-sectional view of the array of FIG. 1.

With reference to FIG. 2, the QVDMOS device 10 is built on a semi-conductor substrate, typically a p-type silicon 30. In the substrate 30 there is a highly doped N+ buried layer 32. On top of buried layer 32 there is a lightly doped N-type epitaxial layer 34. The layer 34 is grown on the substrate 30 above the buried layer 32. Identical source regions 20 have annular regions of shallow N+ doping. The sources 20 are disposed in P-well DMOS bodies 24. In the middle of the diffusions 20 is a body tie 26. Gates 22 surround the sources. The source array 12 is spaced from opposite longitudinally running drains 16 and 18. Each of the drains 16 and 18 comprise heavily doped N-type regions that extend from the surface of the device to the buried layer 32. Drain termination regions 14, 15 respectively space the drains 16, 18 from the source array 12. In operation, when the DMOS device is on, current flows from the sources through a channel made in the DMOS body 24 through the epitaxial layer 34 and into the buried layer 32. Current in the buried layer 32 flows laterally towards the drains 16, 18. Accordingly, in its "on" condition, the QVDMOS device 10 includes a number of resistances such as the resistance of the sources 20, the MOS body resistance 24, the resistance of the epi layer 34, the resistance of the buried layer 32, and the resistance of the drains 16, 18.

In general, the QVDMOS device 10 has a specific "on" resistance. $R_{spON}$, can be reasonably modeled over pertinent conditions by the following relationship:

$$R_{spON} = R_{spD} + \left( \frac{W_v + D}{2} + T \right) \{ R_{shBL}T + \sqrt{(R_{spMOS} + R_{spEPI}) \cdot R_{shBL}} \; ctnh \left( \sqrt{\frac{R_{shBL}}{(R_{spMOS} + R_{spEPI})}} \; \frac{W_v}{2} \right) \} \quad (1)$$

where $R_{spD}$=effective drain sinker specific resistance (ohm*cm$^2$)
$R_{shBL}$=N+ buried layer sheet resistance (ohm/square)
$R_{spMOS}$=effective MOS specific resistance (ohm*cm$^2$)
$R_{spEPI}$=effective epi drift region specific resistance (ohm*cm$^2$)

The dimensions W, D, T, and L are as in FIG. 1. Each R component above exhibits its own unique bias, temperature, and process variations. $R_{spMOS}$ (region 24) is the most variable in the range of pertinent operation for power switches; it may vary by as much as 5:1 with changes in gate bias being the most important source of variation. $R_{spEPI}$ (layer 34) is also important in its variation, especially with process (i.e. epi thickness and doping) and temperature. Both $R_{shBL}$ (layer 32) and $R_{spD}$ (drains 16, 18) are heavily doped silicon and have small to negligible variation with temperature and bias. $R_{spD}$ is typically a very small portion of the total power device number. $R_{shBL}$, on the other hand, is an important element accounting for about 35% of the total power device resistance, so process variations in $R_{shBL}$ are important to accurate pilot devices. The hyperbolic cotangent term accounts for the distributed nature of the vertical DMOS by way of a distributed resistance line model. Under normal operating conditions for an optimized power device, the hyperbolic cotangent can be linearized as below.

$$R_{spON} = R_{spD} + \left( \frac{W_v + D}{2} + T \right) \{ R_{shBL}T + \frac{2}{W_v}(R_{spMOS} + R_{spEPI}) + \frac{W_v}{3} R_{shBL} \} \quad (2)$$

The smallest pilot device would be based on a single source window. As such it would be well described by a lumped element circuit model with $$R_{pON} = R_{pD} + R_{pBL} + R_{pMOS} + R_{pEPIs} + R_{pEDId} \quad (3)$$

Figure 3:
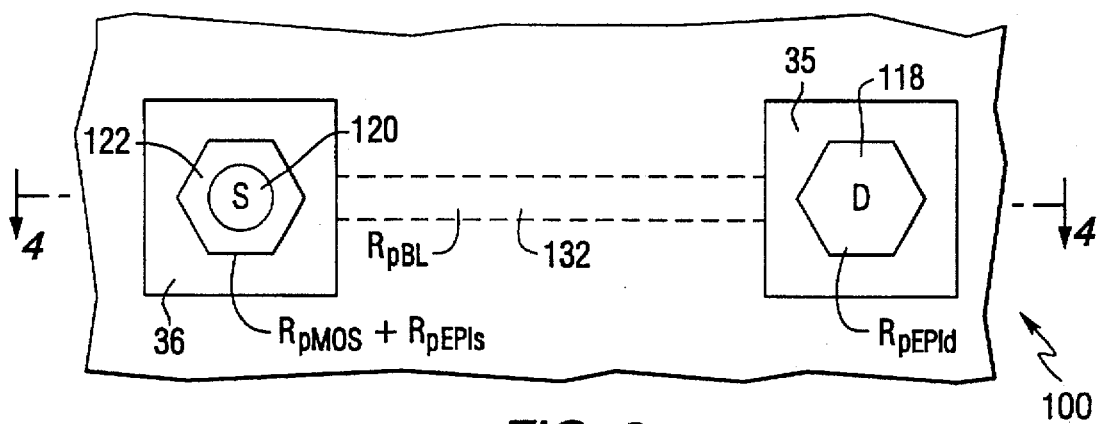
FIG. 3 is a planar view of a pilot transistor for the DMOS device of FIG. 1.

The resistor components are specific to the pilot geometry with the same physical origins as in the full device expression indicated by the subscripts. FIG. 3 shows a general layout of a pilot with these elements. Details of the bias and temperature dependence may still depend on the device geometry, especially for $R_{pMOS}$ and $R_{pEPI}$. The key to matching pilot and power device performance is to have the relative ratios of the four primary resistor elements the same in both devices. Then any variations in any term, to first order, will have the same impact on both the power and pilot devices.

The $R_{pMOS}$ element is best matched by forming a single source window and terminating the gate such that the symmetry lines of the QVDMOS source array are simulated in the pilot. This is easily done by ending the gate electrode 122, with appropriate termination, at the symmetry lines. Such a construction duplicates most of the important geometries that determine this component's behavior at low drain bias. At high drain bias the terminating junction will contribute a depletion spread not present in the power device. However, for most piloting of power switches, only the low drain bias conditions are important since the switch is not intended to sustain high conductance and high voltage simultaneously.

The $R_{pEPIs}$ term also benefits from the single source window construction. However, another geometric discrepancy between pilot and power devices becomes apparent. In the power device 10, symmetry confines the current from crossing the source array symmetry lines (except at edges of the vertical section). In other words, the current travels an almost vertical path to the buried layer 32. In the pilot, the absence of surrounding sources allows the current to spread beyond the source array symmetry lines as it proceeds from the surface to the N+ buried layer. See arrows 130 in FIG. 4. This current spreading reduces $R_{pEPDs}$ below the level required by the component ratios in the power device. That is why a $R_{pEDId}$ term was added to the pilot expression. This term is added by providing another section of vertical current flow through the epi, sized accordingly to add the extra epi resistance needed raise the total $R_{pEPI}$ component to the needed value. This path can replace the drain sinker diffusion (if that term is small enough) or it can be just an extra element in the pilot design. The final term, $R_{pBL}$, is present in the power device due to the distributed drain collection term (with the $W_v/3$ factor) and the drain termination term (with the T factor). Since neither mechanism is inherent in the pilot, care must be taken to include an appropriate N+ buried layer resistor 132 to provide this important component. This is clearly shown in FIGS. 3 and 4.

Figure 4:
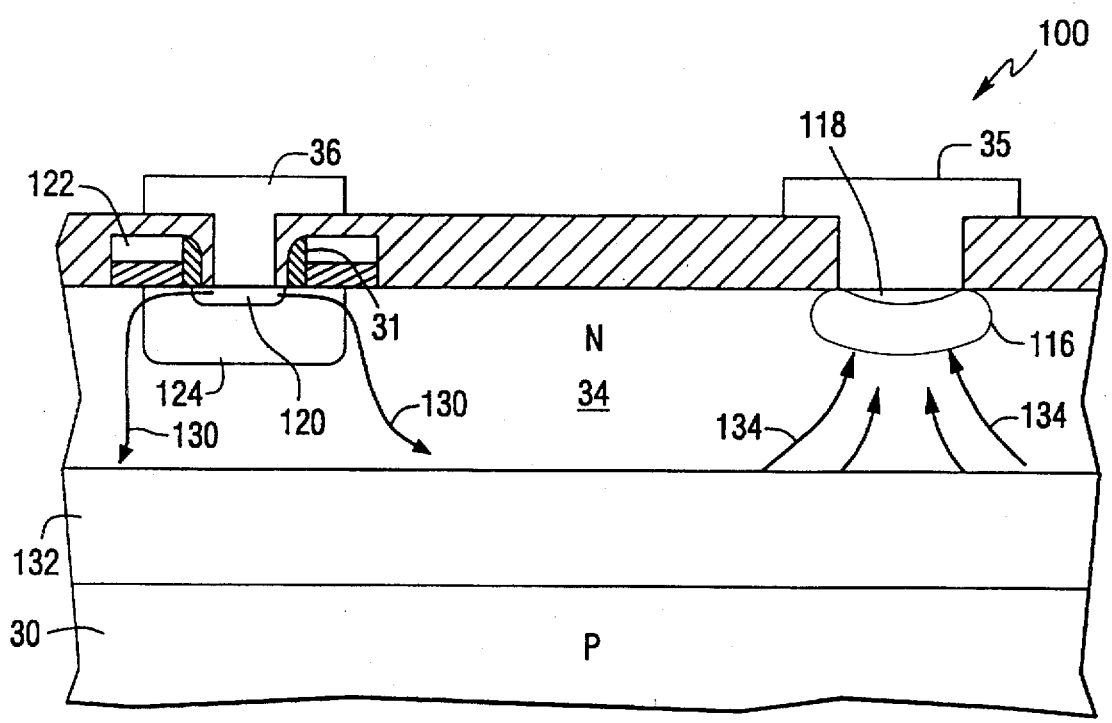
FIG. 4 is a cross-sectional view of the pilot transistor.

Turning to FIGS. 3 and 4, there is shown a pilot transistor 100 that satisfactorily tracks the QVDMOS device 10. The source 120 is a shallow N+ source that is simultaneously formed with the sources 20 of the QVDMOS device 10 on an area of the substrate 30 spaced from the QVDMOS device 10. The source 120 is surrounded by an approximate hexagonal gate 122 in order to maintain the symmetry of the gate source relationship as found between sources 20 and gates 22 in the QVDMOS device 10. Likewise, the drain region 118 is also patterned to have an hexagonal shape. The symmetry between the approximate hexagonal shape of the drain region 118 and the gate 122 allows the drain region 118 to concentrate the current flowing from the buried layer 132 as will be explained hereinafter. Contacts 35, 36 make ohmic contact to the respective surface drain and source regions 118, 120.

The source region 120 is formed in a lightly P doped DMOS body 124 that is simultaneously fabricated with the DMOS body 24 of the source array cells 20. The DMOS body 124 is formed in the same epitaxial layer 34 and has the same light N-type doping as the epitaxial layer 34 that holds the source bodies 24. The buried layer resistor 132 is the same buried layer found in the DMOS device 32. An optional region 116 is found in the drain region 118. The drain region 118 can be fabricated to have a suitable drain resistance to compensate for the current spread from the source. As shown by arrows 130, current from the source tends to spread out laterally in its downward passage towards the buried layer 132. As a result, the effective resistance of the epitaxial region 34 is reduced in the pilot transistor 100. This reduction in effective epitaxial resistance would render the pilot transistor inconsistent with the operation and the "on" resistance of the QVDMOS device 10. So, to compensate for this spread in current, the shallow N+ drain region 118 is formed in an hexagonal shape in order to concentrate current from the buried layer 132 at the surface 50. As such, the symmetrical arrangement tends to provide an "inverse lampshade" for the current from the buried layer resistor 132. So, while the current 130 spreads out from the source and reduces resistance, the hexagonal shape of the drain region 118 tends to concentrate the current along lines 134 and increases resistance. In an alternative embodiment, a further resistance could be added in series with the drain region 118 such further resistance would increase the total on resistance of the pilot device 100 and make up for any remaining differences in the reduction of resistance due to the lateral spreading of current from the source 120.

In summary, the invention provides a suitable pilot transistor 100 that mimics the operation of the DMOS device 10. The isolated pilot transistor 100 employs symmetry in the formation of the gate and the drain and thereby compensates for the lack of symmetry due to the single source isolated from the array. In order to finally compensate for reduced resistance due to current spreading from the source, an epitaxial resistance is added to the drain region and thereby compensates for reduced drift region resistance.

Having disclosed one or more preferred embodiments of the invention, those skilled in the art will appreciate that further modifications, additions and changes thereto may be made without departing from the spirit and scope of the invention as set forth in the following claims. More specifically, the approximate hexagonal shape of the gate 122 and drain region 118 is not critical. Other symmetrical shapes may be used, including, by way of example a circle or an octagon.

What I claim:

1. An integrated circuit comprising:
    a semiconductor substrate with a first conductivity;
    an epitaxial layer of a second, opposite conductivity;
    a quasi-vertical DMOS (QVDMOS) transistor having:
    a highly conductive QVDMOS buried layer region of said second conductivity located at the interface between said semiconductor substrate and said epitaxial layer;
    an array of QVDMOS gates covering a portion of the surface of said epitaxial layer and electrically isolated from said epitaxial layer;
    an array of QVDMOS body regions of said first conductivity located in the surface of said epitaxial layer and extending under the edges of said QVDMOS gate array for defining QVDMOS channel regions of the QVDMOS transistor, said QVDMOS channel regions having in the aggregate a QVDMOS channel resistance;
    an array of QVDMOS drift regions in said epitaxial layer between said QVDMOS channel regions and said QVDMOS buried layer, said QVDMOS drift regions having in the aggregate a QVDMOS drift resistance;
    an array of QVDMOS source regions of said second conductivity located in the QVDMOS body regions and extending to some of the edges of said QVDMOS gate array and contacting said QVDMOS channel regions;
    highly conductive QVDMOS drain regions of said second conductivity extending from the surface of the epitaxial layer to the buried layer and separated from said arrays of QVDMOS gate and QVDMOS body regions;
    a QVDMOS buried layer resistance comprising the aggregate of distributed contributions to resistance in the QVDMOS current flow path from said QVDMOS buried layer below the QVDMOS drain regions and the QVDMOS buried layer below said QVDMOS drift regions;
    said QVDMOS transistor having a total resistance comprising the combined resistances of the QVDMOS channel, QVDMOS drift, and QVDMOS buried layer resistances;
    a pilot transistor electrically isolated from the QVDMOS transistor, said pilot transistor having:
    a pilot gate covering a portion of the surface of said epitaxial layer over a pilot buried layer and electrically isolated from said epitaxial layer;
    a pilot channel region disposed beneath the pilot gate region;
    a pilot body region of said first conductivity located in the surface of said epitaxial layer and extending under the edge of said pilot gate for defining a pilot channel region of the pilot transistor, said pilot channel region having a pilot channel resistance;
    a pilot source region of said second conductivity located in said pilot body region and extending to the edge of said pilot gate and contacting said pilot channel region;
    a highly conductive pilot buried layer region of second conductivity located at the interface between said semiconductor substrate and said epitaxial layer and having a pilot buried layer resistance;
    a pilot source drift region located in said epitaxial layer between said pilot channel region and said pilot buried layer and having a pilot source drift resistance;
    a pilot drain region spaced from the pilot gate and body regions, having a second conductivity;
    a pilot drain drift region located in said epitaxial layer between said buried layer and said pilot drain region and having a pilot drain drift resistance;
    a pilot drift resistance comprising the combination of said pilot source drift resistance and said pilot drain drift resistance;
    said pilot transistor having a total pilot resistance comprising the combination of said pilot channel, pilot drift and pilot buried layer resistances wherein each of said pilot channel, pilot drift and pilot buried layer resistances has the same relative ratio to the total pilot resistance as each of the corresponding QVDMOS channel, QVDMOS drift and QVDMOS buried layer resistances has to the total QVDMOS resistance.

2. The integrated circuit of claim 1 wherein the QVDMOS gate comprises an array with a plurality of source cells, each gate of the array being continuous and having openings and each opening having a first shape and enclosing a QVDMOS source and body region thereby defining an array of QVDMOS source cells, each source cell having a second shape said pilot transistor having a gate opening of said first shape corresponding to the first shape of the QVDMOS gate, said pilot drain and source regions formed in said epitaxial layer and having a surface shape corresponding to the second shape.

3. The integrated circuit of claim 2 wherein the pilot source drift resistance is proportionally less than the drift resistance of the QVDMOS transistor due to the loss of reflection symmetry in the pilot source drift region current flow path and the pilot drain region sized to provide a compensating pilot drain drift resistance in the epitaxial layer to compensate for reduced drift resistance of the pilot transistor.

4. In an integrated circuit formed in a semiconductor substrate and comprising a QVDMOS power device having a symmetrical source array with each source disposed in a body region, a buried layer beneath the source array, a drift region disposed between the body and the buried layer, a channel region, and a drain region in contact with the buried layer, wherein the total resistance of the QVDMOS power device comprises combined resistances of the channel region, the drift region and the buried layer an improvement comprising:

a pilot transistor, electrically isolated from the QVDMOS power device and having a pilot gate, a pilot body, a pilot source, a pilot channel, a pilot drift region and a pilot buried layer region wherein the total pilot resistance comprises the combination of the pilot channel, pilot drift and pilot buried layer resistances and a compensating resistance located between the pilot buried layer and the pilot drain, said compensating resistance having a magnitude sufficient to raise the total pilot drift resistance of the pilot transistor to the same proportion of the total pilot resistance as the proportion of the QVDMOS drift resistance to the total QVDMOS transistor resistance.

5. The integrated circuit of claim 4 wherein the pilot transistor further comprises the gate having an annular shape with its outer periphery corresponding to the symmetry of the QVDMOS source cell and the pilot drain having a shape at the surface of the substrate with a shape corresponding to the outer periphery of the pilot gate.

* * * * *